United States Patent [19]

Cielo et al.

[11] 4,016,482

[45] Apr. 5, 1977

[54] PULSE ENERGY SUPPRESSION NETWORK

[75] Inventors: John Robert Cielo, Kingston; John Andrew Orfitelli, New Paltz, both of N.Y.

[73] Assignee: International Business Machines Corporation, Armonk, N.Y.

[22] Filed: Oct. 31, 1975

[21] Appl. No.: 627,732

[52] U.S. Cl. .............................. 323/17; 307/240; 321/13; 323/DIG. 1
[51] Int. Cl.² .................. G05F 1/56; H03K 17/64
[58] Field of Search ............... 307/240, 246, 253; 321/2, 12, 13; 323/17, 22 T, DIG. 1

[56] References Cited

UNITED STATES PATENTS

| | | | |
|---|---|---|---|
| 3,736,495 | 5/1973 | Calkin et al. | 323/17 |
| 3,818,311 | 6/1974 | Mattson et al. | 321/2 UX |
| 3,859,590 | 1/1975 | Cielo et al. | 323/17 |

OTHER PUBLICATIONS

Hoffman et al., "Transistor Fast Turnoff Insensitive to Drive Transition", IBM TDB, vol. 17, No. 4, Sept. 1974, pp. 1089, 1090.

*Primary Examiner*—A. D. Pellinen
*Attorney, Agent, or Firm*—Frederick D. Poag

[57] ABSTRACT

A power translating circuit of the general kind utilized in transformer coupled transistor switching regulators has a source of DC, the primary of a transformer and a switching transistor in series. To protect the transistor from excessive power dissipation during its turnoff transition, a surge diverting path including a diode poled oppositely to the transistor is provided in parallel with the transistor, the diode being in forward conduction at the beginning of turnoff of the transistor and becoming back-biased as the transistor turns off, the reverse conductivity of the diode during its recovery serving as a temporary path diverting some of the power dissipation at turnoff away from the transistor.

10 Claims, 3 Drawing Figures

PULSE ENERGY SUPPRESSION NETWORK

BACKGROUND OF THE INVENTION

1. Field of the Invention

This invention relates to switching circuits and more particularly to pulse energy suppression during the turnoff transition of high power switching transistor circuits.

2. Description of the Prior Art

Power transistors are widely used in switching mode in regulators, inverters and the like since operation of a transistor between full conduction and cutoff usually results in minimal power dissipation. However, there is necessarily some power dissipation in the transistor during its transition in the active region between these two states, when current is flowing across a substantial potential gradient within the transistor. In transformer-coupled transistor switching regulators wherein energy must be dissipated during reset of the transformer, clamp circuits may be provided across the primary of the transformer to absorb most of the leakage flux and magnetizing energy in the transformer and to limit the voltage excursion impressed upon the transistor as it suddenly interrupts the current flowing through the transformer primary. However, such clamps usually take some time to become operative and in any event do not fully isolate the switching transistor from high potential during its turnoff transition since potential is needed for the transformer resetting action. Typical examples of transistor switching regulators of this general kind are seen in U.S. Pat. Nos. 3,697,852 and 3,859,590, both assigned to the assignee of this application.

The dynamics of turnoff and turnon transitions of a power transistor have been studied extensively. One example of a reference which summarizes some of the techniques which have been suggested in response to this problem is an article by E. T. Calkin and D. H. Hamilton entitled "Current Techniques for Improving the Switching Loci of Transistor Switches in Switching Regulators", 1972 IEEE Industry Applications Society Conference Record, pages 447–484. In that paper, the use of a capacitor to clamp and thus retard the rise of the collector potential of a switching transistor, so as to reduce turnoff dissipation, it shown. However, the transient across the capacitor is a function of its charge and, therefore, the clamping action is imperfect and the switching dissipation reduction is only partial.

SUMMARY OF THE INVENTION

It is a primary object of the present invention to provide an improved turnoff pulse energy suppression means for use in a transistor switching circuit. For this purpose, a slow recovery diode is connected in parallel with the turnoff energy dissipating current path within the transistor, the diode being polled oppositely to the direction of current through the transistor and being biased into forward conduction by a biasing means having a value greater than the potential impressed upon the transistor at the common node of the two circuits when the transistor is conducting and less than the potential at that node when the transistor is fully turned off so that the diode passes from forward to reversed biased state by and during the turning off action of the transistor and the resulting increasing potential at said node. During the reverse recovery time of the diode, it has a low impedance to reverse current, and provides a clamping action which can be made to be very flat for the duration of the transistor turnoff transient followed by a rapid rise to a high impedance state. According to another aspect of the invention, the novel pulse energy suppression means has a timed action which is cooperative with a transformer reset clamp as aforedescribed in a transistor switching regulator circuit to, on the one hand, protect the switching transistor during its turnoff transient, and, on the other hand, to allow an abrupt rise of the potential across the transformer clamp after the turnoff is complete, so as to permit reset of the transformer as rapidly as possible in preparation for a new operative cycle.

Accordingly, an object of the invention is to provide an improved pulse energy suppression network.

Another object of the invention is to provide an improved network as aforesaid operative to protect a switching transistor from excessive power dissipation stresses during the turnoff transition of the transistor.

Still another object of the invention is to provide a network as aforesaid which is operative to absorb some of the reset energy of an inductive network connected in series with such a switching transistor.

Still another object of the invention is to provide an improved pulse energy suppression network as aforesaid in a transformer coupled switching network such as is seen in transformer coupled switching regulators.

Still another object of the invention is to provide an improved pulse energy suppression network in combination with a clamp circuit in a transformer coupled transistor switching network as aforesaid.

The foregoing and other objects, features and advantages of the present invention will be apparent from the following description of a preferred embodiment of the invention as illustrated in the accompanying drawings.

DESCRIPTION OF THE ILLUSTRATED PREFERRED EMBODIMENT

Figure 1:
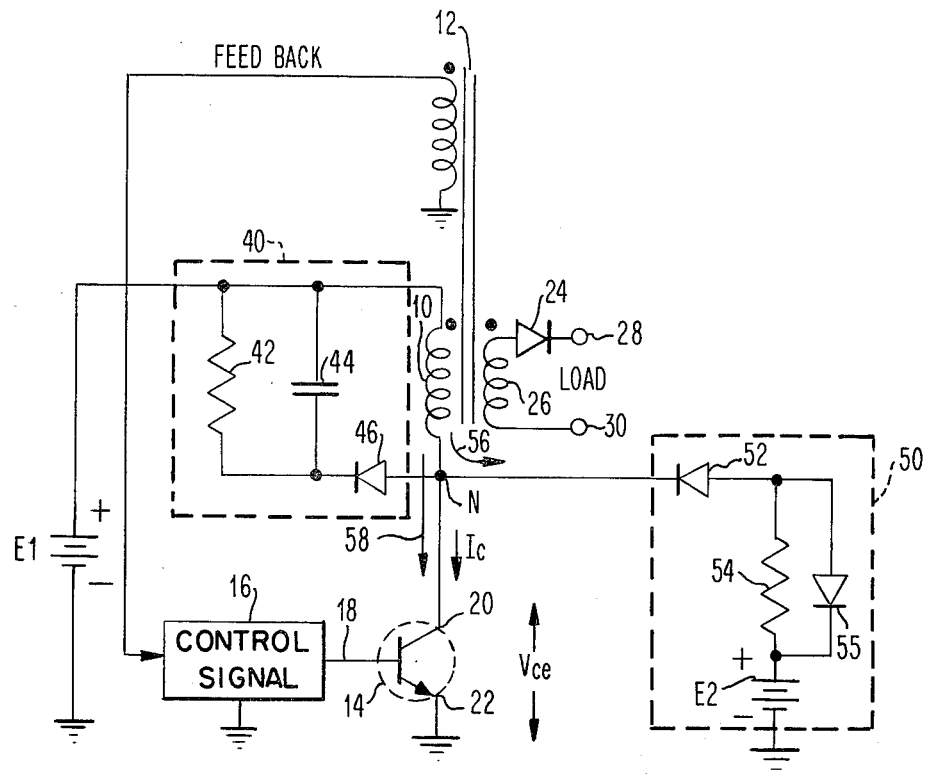
FIG. 1 is a schematic representation of a transistor switching network in which an improved pulse energy suppression network of the invention is employed.

In the circuit of FIG. 1, a source of positive direct current voltage E1 is applied across primary winding 10 of transformer 12 and the collector-emitter circuit of transistor 14, in series. In the operation of the circuit, a control signal source 16 provides on and off drive to the base connection 18 of transistor 14, in a cyclic manner. When transistor 14 is in full conduction, the potential of its collector terminal 20 (and thus the potential of node N) falls to nearly the potential of the emitter terminal 22 of transistor 14.

During conduction of 14, energy is transferred from primary 10 to secondary 26 of transformer 12 and when transisor 14 is turned off by an off drive signal at its base terminal 18, the current in primary winding 10 decays and the potentials of node N and collector terminal 20 rise. In a typical employment of such a circuit such as in a DC–DC transistor switching regulator, a diode 24 is connected in series with a secondary 26 of transformer 12 and the resulting output at 28, 30 is connected through a suitable filter to a useful load, control signal means 16 being operated by a suitable feedback circuit to stabilize the output to the load. The aforementioned U.s. Pat. No. 3,859,590 discloses an example of feedback control in a regulator of this kind.

In "fly-back" operated transformer circuits, the transformer 12 can be reset by operation of the load. However, where, as in the illustrated embodiment, diode 24 is polled to conduct during the "on" time of transistor 14, some means must be provided to reset transformer 12 during the "off" time of 14. One means suitable for this purpose is a clamp circuit 40 which may consist of a resistor 42 and a capacitor 44 connected through a diode 46 across primary winding 10. Thus when the potential of node N rises above the charge on capacitor 44, diode 46 becomes forward biased and energy is transferred from winding 10 to capacitor 44, this energy being dissipated in resistor 42 in preparation for the next cycle of the operation.

As a practical matter, it is necessary that the potential at node N rises high enough so that the volt-time product necessary for resetting 12 will be achieved during the off tme of transistor 14. Accordingly, in the absence of the improvement provided by this invention, there would be a substantial potential at collector terminal 20 of transistor 14 immediately after the onset of turnoff operation of transistor 14 and throughout the completion of that turnoff transient. During the initial part of this turnoff transient, the current into collector 20 of transistor 14 would still be very high for the period of time during which node N rises sufficiently to forward bias diode 46 into significant conduction and therefore potentially destructive power dissipation could occur within transistor 14.

It is a feature of the present invention that pulse energy suppression network 50 is provided to absorb part of the energy dissipation, and, more importantly, prevent the development of a dissipation peak, during this critical period. Network 50 is shown to comprise a diode 52 and a bias supply operative to furnish forward current to diode 52 when the potential at node N has less than a predetermined value, and to accept reverse current from diode 52 when a transient at node N back biases diode 52.

In the illustrated circuit, this bias supply comprises, in series, an impedance such as a resistor 54 shunted in the reverse direction by diode 55, and a potential source E2. Network 50 is connected in parallel with the circuit within transistor 14 to be protected, in this case the collector-emitter circuit 20, 22. Diode 52 is poled to conduct forwardly toward node N, that is oppositely to the normal conduction direction of transistor 14 which is away from node. The value of potential source E2 is made greater than the collector-emitter potential of transistor 14 when transistor 14 is in full conduction and less than the collector-emitter potential of transistor 14 when the latter is fully off. Accordingly, prior to the initiation of the turnoff transient of transistor 14, diode 52 is in forward conduction but becomes reversed biased by and during the turning off action of transistor 14 and the increasing potential of collector terminal 20 and node N which thereby results. Since diode 52 is a slow recovery diode, it accepts current 56 from node N thereby diverting some of the current away from path 58 from primary 10 to collector terminal 20.

Figure 2:
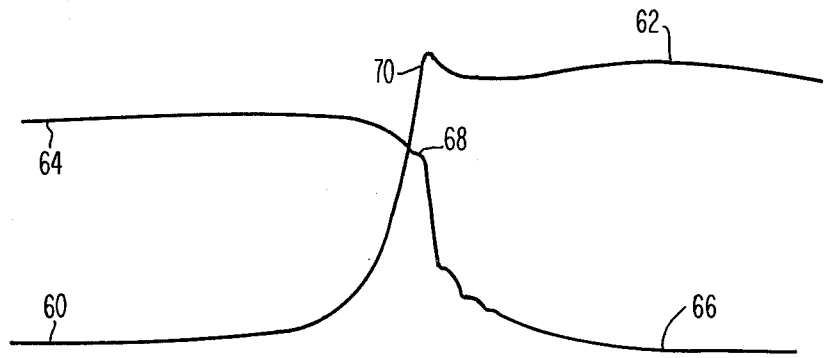
FIGS. 2 and 3 show waveform diagrams indicative of the current and potential transition at the collector of the transistor of FIG. 1 during turnoff of the same, without and with employment of the improved energy suppression network in the circuit, respectively.
Figure 3:
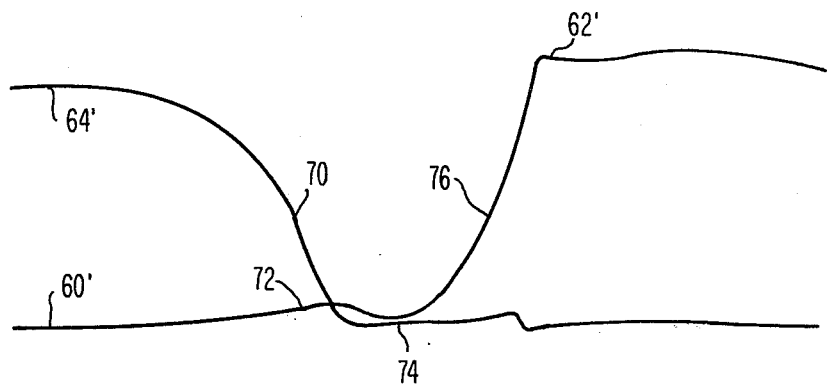

The effect of network 50 is illustrated by comparison of FIGS. 2 and 3. FIG. 2 shows the turnoff transition period for transistor 14 in a circuit like that of FIG. 1, but with circuit 50 omitted. The transition period commences at time T1 when the control signal on base terminal 18 is driven negative and ends at time T4 when the turnoff transition of transistor 14 is substantially complete. During this time the potential Vce at collector terminal 20 and node N rises from value 60 which is nearly ground to the level shown at 62 which is the potential established by clamp 40. At the same time the collector current Ic falls from its peak value at 64 to substantially zero at 66. FIG. 2 illustrates that, in the absence of the pulse energy suppression circuit 50 of the invention, this current fall follows a path shown at 68 wherein the collector current still has a substantial value when the collector potential Vce has already risen to a substantial value 70, in this case its full cutoff value. The period from T2 to T3 is seen to be a time of heavy dissipation in transistor 14.

If, however, the pulse energy suppression circuit 50 of the invention is utilized, the circuit performance is altered as illustrated in FIG. 3. The turnoff operation begins at tme T1'. From T1' to T2', the Vce of transistor 14, that is, the potential at node N, rises from its nearly zero value at 60' toward the clamp value established by E2 at which diode 52 begins to reverse. During this time, the forward current through diode 52 falls to zero, and then reverse recovery current 56 diverts current away from path 58, as indicated by the rapid fall of Ic of transistor 14 at 70.

In the meantime, Vce remains clamped at a moderate level 72 until reverse recovery of diode 52 is nearly complete at T3'. By that time, Ic has fallen to a very low level 74. As diode 52 begins to block the clamping action of network 50, the potential at node N, and thus Vce of transistor 14, rises rapidly as shown at 76 to level 62' established by clamp 40. During this time, Ic remains low because transistor 14 has had time, between T2' and T3', to become substantially fully cutoff. Since Ic has fallen before Vce rises there is no time of heavy power dissipation in transistor 14.

The curves of FIGS. 2 and 3 are representative of the operation of the pulse energy suppression network of the invention in the environment of a circuit of the general kind of FIG. 1. These curves are shown to illustrate the general nature of the switching phenomena addressed by this invention and, for convenience, were taken from a test set-up rather than from an actual regulator.

In this test setup a power supply was used in place of the resestor 42- capacitor 44 portions of clamp 40, a large inductor was used in place of transformer 12 and an oscilloscope coordinated manual control in place of the feedback and control 16 of FIG. 1. The following table gives values for that test setup:

| | |
|---|---|
| Supply E1: | 40 volts |
| Clamp 40: | 300 volts |
| Vce excursion: | 340 volts |
| Ic excursion: | 2.8 amperes |
| Transistor 14: | Matsushita 2SD380 |
| Diodes 52 and 55: | Motorola 225D095 |
| Impedance 54: | 14 ohms |
| Bias Supply E2: | 12 volts |

In another test, using the same setup but substituting a Motorola 2N6308 switching transistor in place of the above listed Matsushita 2SD380 transistor, the fall of Ic was more rapid and there was a brief rise of Vce to about one-fourth of its full value before clamp 50 became fully effective. Also, there were a few small oscillations in Ic and Vce after this abrupt transition, but the general nature of the improvement provided by clamp 50 was the same.

In a practical circuit, the bias source E2, 54, 55 can be provided in a variety of ways, the main point being that diode 52 is in forward conduction at about time T1' and is sufficiently slow in its recovery to be still in heavy reverse conduction at time T3'. Thus, potential E2 could be gated on by control 16 when needed for this purpose or could be derived from transients in control 16 shortly before transistor 14 begins its turnoff transistion. These and other variations of design form no part of the present invention, per se.

It will be obvious that if a PNP transistor were substituted for NPN transistor 14, the collector potential E1 applied thereto would, accordingly, be negative instead of positive. Bias supply E2 would also be negative and the polarities of diodes 46, 52 and 55 would be reversed so as to operate in the same manner as the illustrated circuit, with all potentials and currents simply reversed in direction. Accordingly, in the foregoing potentials and current are referred to as having certain "values" without regard to sign except when applied to a specific embodiment. In the circuit of FIG. 1, the potential at node N varies from ground to a positive limit established by the sum of E1 and clamp circuit 40. Also, the reverse recovery current of diode 52 is away from node N. If the circuit were modified by literal substitution of a PNP switching transistor in place of an NPN one, all currents would have opposite direction and all potentials would have the opposite sign, but the principle of the operation would be exactly the same. That principle of operation is that clamp circuit 50, by reason of the storage characteristics of diode 52 with respect to the storage characteristics of transistor 14, operates to clamp Vce of transistor 14 at a low value until Ic of transistor 14 is brought to a low value during the turnoff transition of transistor 14, whereby there is no time at which a high peak of power dissipation occurs within transistor 14.

Accordingly, while the invention has been particularly shown and described with reference to a preferred embodiment thereof, it will be understood by those skilled in the art that various changes in form and detail may be made therein without departing from the spirit and scope of the invention.

What is claimed is:

1. In a switching circuit, a switch element having conducting and open circuit states,
   potential means establishing current flow through said element when said element is in said conducting state,
   and a clamp circuit adapted to restrain rise of potential across said switch during turnoff transition from said conducting state to said open circuit state,
   said clamp comprising a diode connected in shunt across said element and poled oppositely to the direction of said current,
   and bias means to establish forward current through said diode at least immediately prior to said transition, said bias means being adapted to accept recovery current from said diode as said diode is reverse biased by said potential means during said transition,
   said diode having a reverse recovery time characteristic at least equal to a substantial part of said transition time whereby said diode acts as a timed clamp across said element during said transition.

2. In a transistor switching circuit, a transistor having at least a collector and emitter,
   loss absorbing means comprising,
   a slow recovery diode connected in parallel with the collector-emitter circuit of said transistor and poled oppositely to the direction of the collector-emitter current through said transistor, and
   means for biasing said diode into forward conduction,
   said biasing means having a value greater than the collector-emitter potential of said transistor when said transistor is in a first, higher level of conduction and less than said collector-emitter potential when said transistor is in a second, lower level of conduction,
   whereby said diode is reverse biased from forward to reverse recovery conductive states by and during transient action of said transistor from said higher to said lower level and the increasing potential of the collector-emitter potential difference thereacross.

3. The circuit of claim 2, wherein said biasing means comprises a forward current limited potential source.

4. The circuit of claim 2, further comprising an inductive reactance in series with said transistor, a connection node existing between said reactance and said transistor,
   and wherein said loss absorption means is connected between said node and a reference point in said circuit.

5. In a transistor switching regulator including a power switching transistor inductively coupled to a load circuit and control means for switching said transistor between conductive and substantially non-conductive states, the improvement comprising a collector-emitter circuit turnoff loss absorption means for said transistor comprising,
   a slow recovery diode connected in parallel with the collector-emitter path of said switching transistor and poled oppositely to the direction of the collector-emitter current through said transistor, and
   means for biasing said diode into forward conduction, said biasing means having a value greater than the collector-emitter potential of said transistor when said transistor is in conduction and less than collector-emitter potential when said transistor is fully off,
   whereby said diode is reverse biased from forward to reverse recovery conductive states by and during the turning off action of the transistor and the increasing potential resulting across said transistor so as to restrain rise in said potential and resulting dissipation in said transistor during the turn-off transition thereof.

6. A regulator in accordance with claim 5, wherein said biasing means comprises a forward current limited potential source.

7. A regulator in accordance with claim 6, wherein the inductive coupling comprises a transformer having a secondary coupled to a load and a primary connected in series with said switching transistor.

8. A regulator in accordance with claim 7, further including a diode capacitor clamp circuit connected to said transformer to limit the rise of potential across said transistor to a predetermined transformer reset value after said slow recovery diode becomes shut off, so as to absorb any remaining turnoff loss of the transistor switching circuit.

9. A regulator in accordance with claim 5, wherein the inductive coupling comprises a transformer having a secondary coupled to a load and a primary connected in series with said switching transistor at its collector.

10. A regulator in accordance with claim 9, further including a transformer reset clamp connected in circuit with said transformer to absorb transformer reset energy after said slow recovery diode becomes shut off.

* * * * *